United States Patent
Schreck (10) Patent No.: US 6,614,711 B2
(45) Date of Patent: Sep. 2, 2003

(54) ROW DECODER SCHEME FOR FLASH MEMORY DEVICES

(75) Inventor: John Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/007,294

(22) Filed: Nov. 8, 2001

(65) Prior Publication Data

US 2003/0086327 A1 May 8, 2003

(51) Int. Cl.$^7$ .............................. G11C 8/00; G11C 7/00
(52) U.S. Cl. .............................. 365/230.06; 365/189.02
(58) Field of Search ................. 365/230.06, 230.02, 365/189.02, 189.08, 189.09, 185.33, 189.11, 226

(56) References Cited

U.S. PATENT DOCUMENTS

| | | | |
|---|---|---|---|
| 5,371,705 A | * 12/1994 | Nakayama et al. | .... 365/185.23 |
| 5,392,253 A | * 2/1995 | Atsumi et al. | ......... 365/230.06 |
| 5,886,923 A | * 3/1999 | Hung | .................... 365/185.11 |
| 6,069,518 A | * 5/2000 | Nakai et al. | ................. 327/535 |
| 6,091,633 A | * 7/2000 | Cernea et al. | ......... 365/185.13 |

* cited by examiner

*Primary Examiner*—Thong Le
(74) *Attorney, Agent, or Firm*—Dorsey & Whitney LLP (57) ABSTRACT

Devices and methods for enhancing decoding a non-volatile memory device are discussed. One aspect of the present invention includes a method for decoding a non-volatile memory device. The method includes decoding a set of input signals to present a row decoded signal; driving a node by a driver that receives the decoded signal; transferring a negative supply to a word line by a transfer mechanism; and limiting a rate of flow of electric charge from the negative supply to the word line so as to inhibit an undesired rate of flow of electric charge from the negative supply to the word line.

67 Claims, 6 Drawing Sheets

ROW DECODER SCHEME FOR FLASH MEMORY DEVICES

TECHNICAL FIELD

The technical field relates generally to non-volatile memory. More particularly, it pertains to enhancing row decoding for Flash memory devices.

BACKGROUND OF THE INVENTION

Flash memory is a programmable, read-only, non-volatile memory similar to EPROM and electrically erasable programmable read-only memory (EEPROM). Flash memory differs from these other memory types in that erase operations are done in blocks.

Flash, EPROM, and EEPROM all must be erased before being written. When erasing EPROM, the entire chip is erased at once. EEPROM is automatically erased before a write on a byte basis. Flash is either erased in blocks (boot block or sectored erase block flash) or the entire chip at once (bulk erase flash).

Flash memory is composed of cells. Each cell is structured as a CMOS field effect transistor that incorporates a floating gate interposed between a control gate and the substrate of the transistor. The floating gate is isolated from the substrate by a thin oxide layer. An interpoly dielectric layer separates the floating gate from the control gate. The isolation of the floating gate from the substrate allows charges to be stored. This storage of charge is allows information to be stored and accessed whenever it is desired.

The charges are produced from two n-type diffusion regions formed from a silicon substrate. One of the n-type diffusion regions defines a drain and the other the source. These n-type diffusion regions are formed in the substrate of the cell. The substrate is a typical p-type layer formed from a silicon substance. When the cell is properly biased, an inversion layer forms in the p-type layer. The inversion layer allows the passage of charges. These charges can be used to store information on the floating gate of the cell.

The cells are arranged in rows and columns. To access a cell for reading, writing, or erasing, a particular row and a particular column are selected. A row of cells can be selected by presenting a row signal to a particular word line connected to the control gates of cells in the selected row. There may be multiple word lines to support multiple rows. A column of cells can be selected by presenting a column signal to a particular bit line connected to the drains of the cells in the selected column. There may be multiple bit lines to support multiple columns. When a particular word line and a particular bit line are selected, they identify a desired cell for access.

Due to manufacturing defects, a word line may undesirably short to a bit line. This will wreak havoc on the proper operation of a memory device. Multiple word lines are typically connected to a common voltage supply. Depending on the polarity of the common voltage supply, a large current may be drawn from the common voltage supply to flow through the word line, to the bit line that is shorted to the word line, to the drain of the cell that is connected to the bit line, and to the substrate of the cell when the junction formed from the interface of the drain and the substrate of the cell is forward biased. This large current may inhibit the common voltage supply to maintain its voltage level to support other word lines. This would render the memory device defective.

Thus, what is needed are devices and methods for enhancing row decoding so as to allow the short from the word line to the bit line to be repaired.

SUMMARY OF THE INVENTION

Devices and methods to support enhancing row decoding are discussed. An illustrative aspect includes a decoder for addressing a non-volatile memory device. The decoder includes a row decoder that receives input signals and outputs a decoded signal; a driver that receives the decoded signal to drive a word line; and a limiter that couples the word line to a negative supply. The limiter limits the current supplied to the word line by the negative supply so as to inhibit an undesired rate of flow of charge from the negative supply.

Another illustrative aspect includes a row decoder that receives input signals and outputs a decoded signal; a driver that receives the decoded signal to drive a node; a transfer mechanism to transfer a negative voltage to a word line; and a limiter that couples the word line to a negative supply.

Another illustrative aspect includes a method for decoding a non-volatile memory device. The method includes decoding a set of input signals to produce a row decoded signal; driving the row decoded signal so as to present a word line; and limiting a rate of flow of electric charge from the negative supply to the word line so as to inhibit an undesired rate of flow of electric charge from the negative supply to the word line.

Another illustrative aspect includes a method for decoding a non-volatile memory device. The method includes decoding a set of input signals to present a row decoded signal; driving a node by a driver that receives the decoded signal; transferring a negative supply to a word line by a transfer mechanism; and limiting a rate of flow of electric charge from the negative supply to the word line so as to inhibit an undesired rate of flow of electric charge from the negative supply to the word line.

DETAILED DESCRIPTION OF THE INVENTION

In the following detailed description of exemplary embodiments of the invention, reference is made to the accompanying drawings, which form a part hereof, and in which are shown, by way of illustration, specific exemplary embodiments in which the invention may be practiced. In the drawings, like numerals describe substantially similar components throughout the several views. These embodiments are described in sufficient detail to enable those skilled in the art to practice the invention. Other embodiments may be utilized and structural, logical, electrical, and other changes may be made without departing from the spirit or scope of the present invention. The following detailed description is, therefore, not to be taken in a limiting sense, and the scope of the present invention is defined only by the appended claims.

Figure 1:
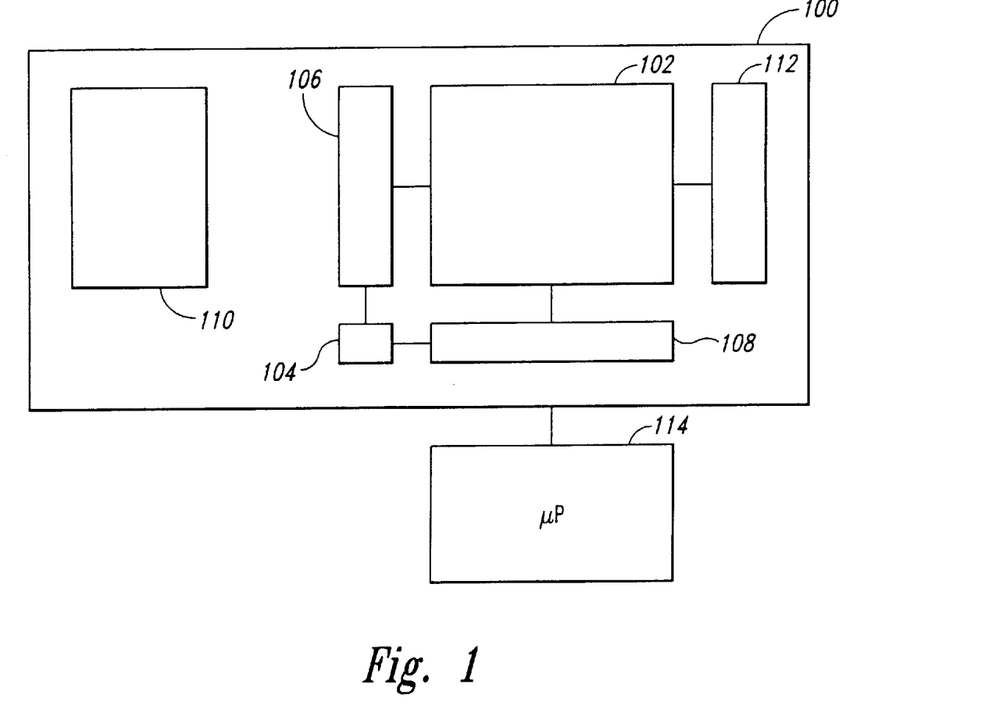
FIG. 1 is a block diagram of a memory device according to one aspect of the present invention.

FIG. 1 is a block diagram of a memory device according to one embodiment of the present invention. The memory device 100 includes an array of memory cells 102, address decoder 104, row access circuitry 106, column access circuitry 108, control circuitry 110, and input/output circuit 112. The memory device 100 can be coupled to an external microprocessor 114 or memory controller for memory accessing. The memory device 100 receives control signals from the processor 114. The memory device 100 is used to store data, which is accessed via I/O lines. One skilled in the art understands that additional circuitry and control signals can be provided, and that the memory device 100 has been simplified to help focus on the embodiments of the present invention.

The embodiments of the present invention focus on solving problems associated with the shorting of a word line to a bit line. As discussed hereinabove, the drain of the cell is located adjacent to the substrate. The drain is an n-type diffusion region whereas the substrate containing the n-type diffusion region drain is a p-type substrate. The interface of the n-type diffusion region and the p-type substrate forms a PN junction diode. A depletion region is formed in the PN junction. An electric field is automatically set up in the depletion region preventing charges from flowing between the n-type diffusion region and the p-type substrate. Also, the p-type substrate is typically tied to ground. Therefore, the diode is reverse-biased., In an ideal condition, current will not flow from the drain to the substrate.

Manufacturing defects may cause a word line to be coupled to a bit line to create a short. If the word line were to be connected to a negative voltage supply, current would flow from the word line to the bit line, and then to the drain of the cell. Because the negative voltage supply is applied to the drain, the diode is forward-biased. Current can then undesirably flow from the negative voltage supply to the substrate. The embodiments of the present invention solve this problem by limiting the current that is caused to flow because of the undesired short. This allows the memory device to be repaired using various on-board repair techniques. One suitable technique includes isolating the defective area of the memory device.

Another problem that may be solved by the embodiments of the present invention is caused by the gradual increase in the threshold voltage range of erased memory cells with an increasing number of erase cycles. As the range of erased threshold voltages increases, so does the likelihood that deselected cells will leak current from a bit line sharing a bit being programmed. During programming of a cell, one cell is selected while other cells are deselected. To access a cell for programming, the voltage level of a particular word line is brought to a programming voltage supply and the voltage level of a particular bit line is brought to a high voltage supply. Recall that the drain of a group of deselected cells in the same column as the selected cell is also connected to the particular bit line. This group of deselected cells is deselected because the word lines to these deselected cells are typically at a low voltage level. During programming of the selected cell, high voltage must be applied to the bit line so that charges are injected from the n-type diffusion region source through the inversion region to enter the floating gate of the selected cell. Any leakage from the deselected cells will reduce the voltage applied to the bit line which will make programming more difficult.

The embodiments of the present invention may solve this problem by presenting to the control gates of the group of deselected cells a negative voltage supply. The negative voltage supply inhibits the leakage current.

One skilled in the art understands that the above description of a memory device is a general description of all the elements and features of a memory device so as to focus on the embodiments of the present invention. Further, the invention is equally applicable to any size and type of memory circuit and is not intended to be limited to the memory described above. Other types of devices include DRAM (Dynamic Random Access Memory), or SRAM (Static Random Access Memory). Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synclink or Rambus DRAMs and other emerging or future memory technologies.

As recognized by those skilled in the art, memory devices of the type described hereinabove and hereinbelow are generally fabricated as an integrated circuit containing a variety of semiconductor devices. The integrated circuit is supported by a substrate. Integrated circuits are typically repeated multiple times on each substrate. The substrate is further processed to separate the integrated circuits into dies.

Figure 2:
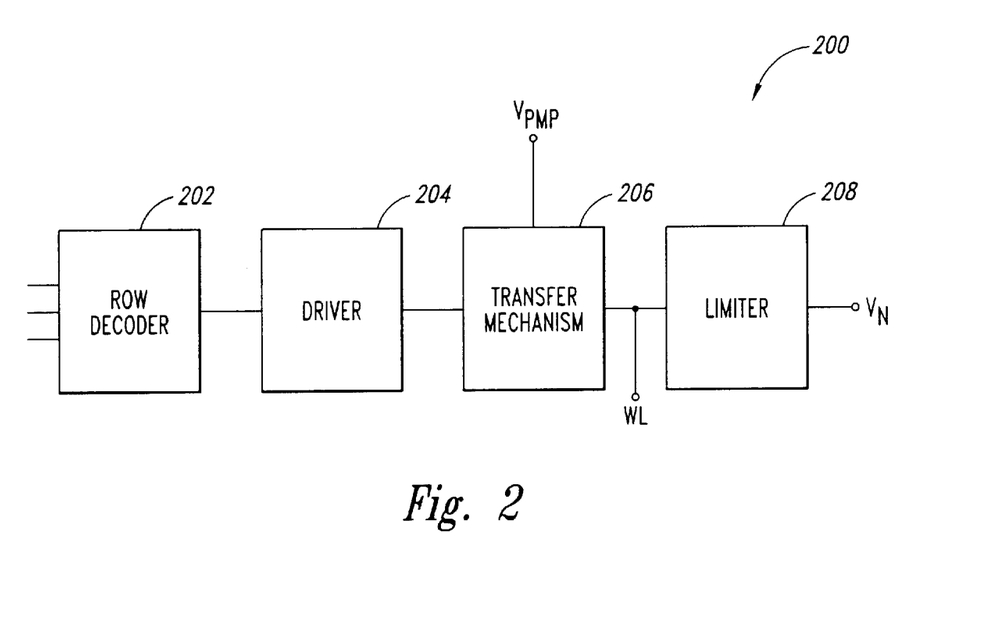
FIG. 2 is a block diagram of a decoder according to one aspect of the present invention.

FIG. 2 is a block diagram of a decoder 200 according to one aspect of the present invention. The decoder 200 includes a row decoder 202. The row decoder 202 receives a number of pre-decoded signals. The row decoder 202 processes these pre-decoded signals to produce a decoded signal. The row decoder 202 presents the decoded signal to a driver 204.

The driver 204 receives the decoded signal. Depending on the decoded signal, the driver 204 will drive its output to a voltage supply or to ground. The voltage of the voltage supply is typically at Vcc. During programming of a cell, the voltage supply is boosted to a programming voltage supply Vpp.

A transfer mechanism 206 is receptive to a Vpmp signal. The Vpmp signal is a pumped voltage signal. In one embodiment, the Vpmp is pumped to a negative voltage level. Depending on the state of the Vpmp signal, the transfer mechanism 206 either connects the word line node WL to the driver or isolates the word line node WL from the driver. If the transfer mechanism 206 connects the node WL to the driver 204, then the voltage at the node WL is dependent on the voltage at the output of the driver 204. This voltage can either be at the voltage supply Vcc or Vpp or ground. The transfer mechanism 206 may also disconnect the node WL from the driver 204 depending on the Vpmp signal. If the node WL is disconnected from the driver 204, the voltage level of the node WL depends on the negative voltage supply Vn. This means that the voltage level of the node WL may be negative.

The node WL is typically either at a high voltage level, which means that the row of cells coupled to the node WL is selected, or at low voltage level, which means that the row of cells coupled to the node WL is deselected. The negative voltage supply Vn provides a third state to the node WL. In certain conditions, a negative voltage level at the node WL enhances the operations of the memory device, such as for preventing leakage during programming.

The decoder 200 includes a limiter 208. The limiter 208 limits the current that is supplied by negative voltage supply Vn to the node WL. In one embodiment, the limiter 208 limits the current so as to allow the memory device to be repaired for a short between the word line and the bit line. The limiter 208 aids the negative voltage supply to maintain its voltage level for other word lines connected to the negative voltage supply. Without the presence of the limiter 208, the negative voltage supply will have to source a large current flowing through the short, and would be unable to maintain its voltage level.

Figure 3:
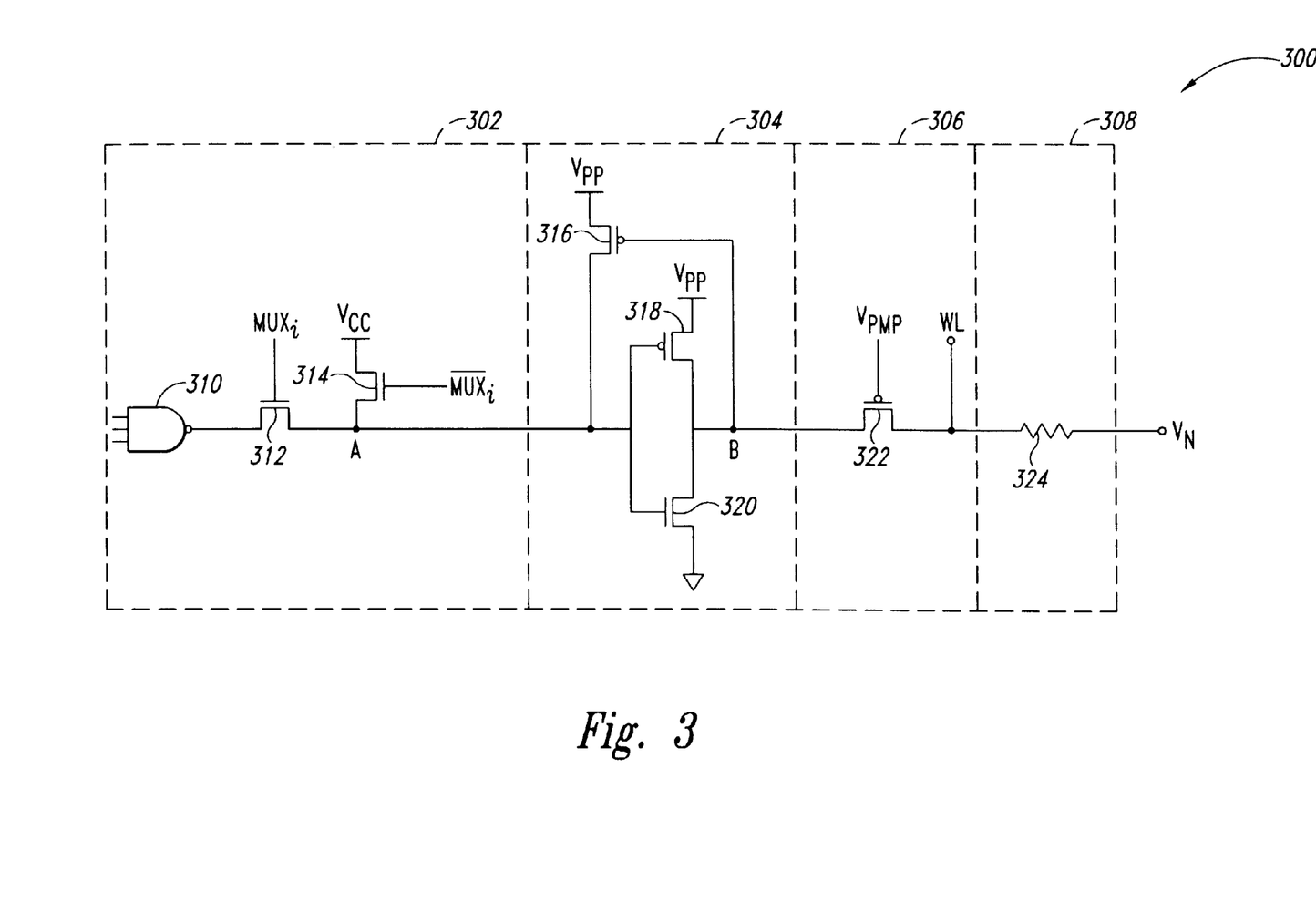
FIG. 3 is a circuit diagram of a decoder according to one aspect of the present invention.

FIG. 3 is a circuit diagram of a decoder 300 according to one aspect of the present invention. The decoder 300 includes a row decoder 302, a driver 304, a transfer mechanism 306, and a limiter 308. The row decoder 302 is similar to the row decoder 202 discussed in FIG. 2. The driver 304 is similar to the driver 204 discussed in FIG. 2. The transfer mechanism 306 is similar to the transfer mechanism 206 discussed in FIG. 2. The limiter 308 is similar to the limiter 208 discussed in FIG. 2. The discussion in FIG. 2 that is pertinent to these similar elements is incorporated here in full.

The row decoder 302 includes a NAND gate 310. The NAND gate 310 receives a number of input signals. These input signals are pre-decoded signals whose combination determines a row to be selected or deselected for memory operations. The NAND gate 310 produces a processed signal and presents the processed signal to an n-channel transistor 312.

The transistor 312 is a three-terminal device having a gate, a source, and a drain. The source of the transistor 312 is coupled to the output of the NAND gate 310 to receive the processed signal. The drain of the transistor 312 presents the processed signal to a node A depending on the MUXi signal applied to the gate of the transistor 312. The MUXi signal is another pre-decoded signal whose combination with the input signals discussed above selects or deselects a particular row of the memory array. If the MUXi signal is at a high voltage level, the transistor 312 will couple the processed signal at the drain of the transistor 312.

The row decoder 302 includes another n-channel transistor 314 having a gate, a source, and a drain. The source of the transistor 314 is coupled to the node A. The drain of the transistor 314 is coupled to a voltage supply Vcc, and the gate of the transistor 314 is coupled to the inverse of the MUXi signal. When the MUXi signal is low, transistor 314 is turned on to pull the node A to the voltage supply Vcc. The row decoder 302 as discussed hereinabove is suitable for the embodiments of the present invention. But other suitable row decoders may be used as well.

The driver 304 includes an inverter formed from the p-channel transistor 318 and an n-channel transistor 320. The gate of the transistor 318 is coupled to the node A, the source of the transistor 318 is coupled to the programming voltage supply Vpp, and the drain of the transistor 318 is coupled to the node B. The gate of the transistor 320 is coupled to the node A, the source of the transistor 320 is coupled to ground, and the drain of the transistor 320, is coupled to the node B.

The programming voltage supply Vpp is typically at the same level at the voltage supply Vcc. During programming, the programming voltage supply Vpp is boosted to a much higher voltage level when the decoder is selected.

When the node A is at a high voltage level, the node B is at a low voltage level because of the inverter. The node B in this case will turn on the p-channel transistor 316. The transistor 316 will then pull the node A to the programming voltage. This helps to overcome the threshold voltage drop associated with the transistor 312 or 314 so as to allow the transistor 320 to ensure that the transistor 318 is completely switched off and to pull the node B fully to ground.

The transfer mechanism 306 includes a p-channel transistor 322. The pumped voltage Vpmp applied to the gate of the transistor 322 can be of one of two levels: ground or negative. When the pumped voltage Vpmp is at a negative voltage level, the voltage at node B is coupled to a word line. When both the pumped voltage Vpmp and the node B are at ground, the word line can be pulled to a negative voltage level by the negative voltage supply Vn because the transistor 322 is switched off to decouple the driver from the node WL.

The limiter 308 includes a resistor 324 in one embodiment. In another embodiment, the limiter 308 is a highly resistive compound. In a further embodiment, the limiter 308 is a polysilicon compound that is lightly doped to provide a predetermined level of resistivity. In other embodiments, the limiter 308 may be formed from other substances and compounds. When the memory device is in a programming mode or an erase mode, that is, when it is desirable for the node WL to be at a negative voltage, the limiter 308 limits the current the negative voltage supply Vn must provide in the event a large current sink is created, for example, where a word line is short circuited to the substrate. In one embodiment, the negative voltage supply Vn is about −1 volts in a programming mode, and less than −9 volts when in an erase mode.

The row coupled to the node WL is selected by switching the node WL to a high voltage level. This occurs when the NAND gate 310 produces a low voltage signal. The MUXi signal is at a high level to allow the transistor 312 to present the low voltage signal to the node A. The low voltage signal turns on the transistor 318. The transistor 318 pulls the node B to the programming voltage supply. The pumped voltage Vpmp may be at a negative voltage level or ground to turn on the transistor 322. For the discussion hereinabove and hereinbelow, the negative voltage level of Vpmp to turn on the transistor 322 is more negative than the threshold voltage of a p-channel transistor. The transistor 322 couples the node WL to the node B. Because the node B is pulled to the programming voltage supply by the transistor 318, the node WL is also pulled to the programming voltage supply.

The row coupled to the node WL is deselected by coupling the node WL to a low voltage level. This can occur in one of two ways. First, when the NAND gate 310 produces a high voltage signal and the MUXi signal is at a high level to allow the transistor 312 to couple the high voltage signal to the node A. Second, when the MUXi signal is at a low level, thereby decoupling the output of the NAND gate 310 from and coupling a Vcc voltage to the node A. In either case, the high voltage signal at node A turns on the transistor 320 thereby pulling the node B to ground. The pumped voltage Vpmp must be at a negative voltage level to turn on the transistor 322 thereby coupling the node WL to the node B. Because the node B is pulled to ground by the transistor 320, the node WL is also pulled to ground.

The word line can also be pulled to at a negative voltage supply Vn when the node A is at a high voltage signal. As previously described, a high voltage signal at the node A turns on the transistor 320 to pull the node B to ground. However, where the word line is to be pulled to a negative voltage, the pumped voltage Vpmp is also at ground to turn off the transistor 322. Consequently, the transistor 322 decouples the node WL from the node B. The node WL can then pulled down to a negative voltage through the limiter 308 by the negative voltage supply Vn.

The memory device can be placed in a stand-by mode by making the pumped voltage Vpmp held at ground potential. This turns off the transistor 322 to decouple the node WL from the node B. The node WL is then under the control of the negative voltage supply. For stand-by mode, the output of the negative voltage supply Vn is switched to ground in order to save power drawn by the negative voltage supply Vn. The pumped voltage Vpmp is also placed at ground in order to save the power necessary to maintain Vpmp at a negative voltage. When the memory device is switched out of the stand-by mode, the voltage Vpmp is quickly pumped to a negative level. This can be done using a relatively large capacitor to boost the pumped voltage Vpmp down to a negative level.

Figure 4:
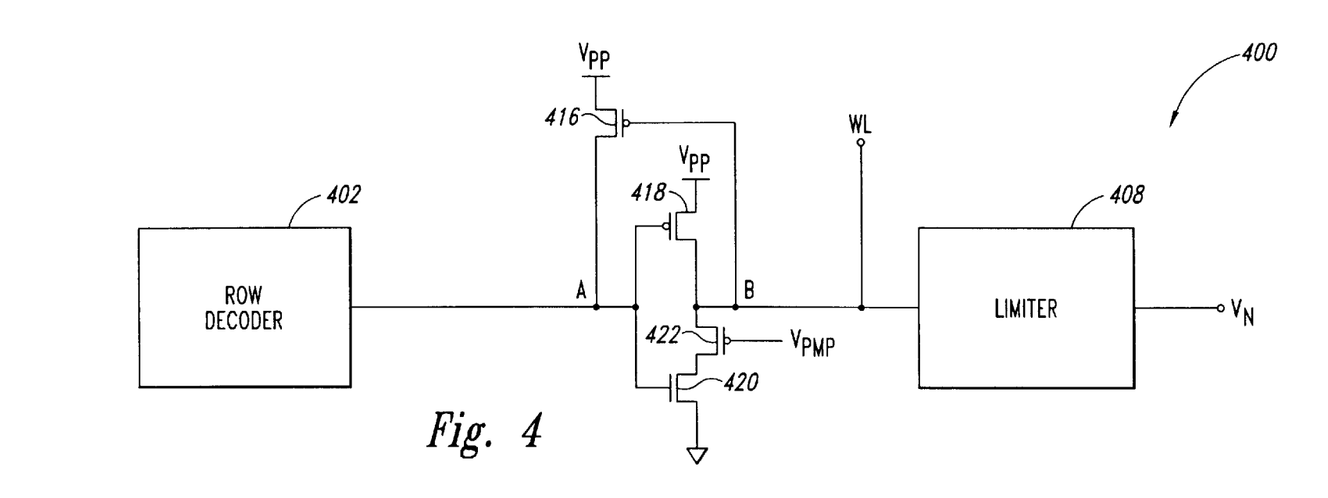
FIG. 4 is a circuit diagram of a decoder according to one aspect of the present invention.

FIG. 4 is a circuit diagram of a decoder 400 according to one aspect of the present invention. The decoder 400 includes a row decoder 402 and a limiter 408. The row decoder 402 is similar to the row decoder 202 discussed in FIG. 2. The limiter 408 is similar to the limiter 208 discussed in FIG. 2 The discussion in FIG. 2 that is pertinent to these similar elements is incorporated here in full.

The decoder 400 still includes a driver, which is formed from the p-channel transistor 416, the p-channel transistor 418, and the n-channel transistor 420. The p-channel transistor 416 is similar to the transistor 316 discussed in FIG. 3. The p-channel transistor 418 is similar to the transistor 318 discussed in FIG. 3. The n-channel transistor 420 is similar to the transistor 320 discussed in FIG. 3. The discussion in FIG. 3 that is pertinent to these similar elements is incorporated here in full.

The p-channel transistor 422 is similar to the transistor 322 discussed in FIG. 3. However, it has been relocated. The operation of this configuration is the same as the configuration discussed in FIG. 3 except that the path to the programming voltage supply to the node B is burdened by only transistor 418, thus enabling faster charging of the node B. This configuration adds flexibility to circuit designer who may be constrained by design rules to improve space layout and other factors.

The row coupled to the node WL is selected by switching the node WL to a high voltage level. This occurs when row decoder 402 produces a low voltage signal. The low voltage signal turns on the transistor 418 and switches off the transistor 420. Consequently, the transistor 418 pulls the node B to the Vpp voltage of the programming voltage supply. Note that because the transistor 420 is switched off, the conductive state of the transistor 422 is inconsequential. The node WL is the same as the node B. Because the node B is pulled to the programming voltage supply by the transistor 418, the node WL is also pulled to the programming voltage supply.

The row coupled to the node WL is deselected by coupling the node WL to a low voltage level. This occurs when the row decoder 402 produces a high voltage signal to turn on the transistor 420. The pumped voltage Vpmp is at a negative voltage level to turn on the transistor 422. Because both the transistor 420 and the transistor 422 are turned on, the node B is pulled to ground. For the discussion hereinabove and hereinbelow, the negative voltage level of Vpmp to turn on the transistor 422 is more negative than the threshold voltage of a p-channel transistor. Because the node B is pulled to ground, the node WL is also pulled to ground.

The word line can also be pulled to at a negative voltage supply Vn when the row decoder 402 produces a high voltage signal. The high voltage signal turns on the transistor 420 and switches off the transistor 418. The pumped voltage Vpmp is at a low voltage level to turn off the transistor 422. The transistor 422 decouples the node WL from the transistor 420. Because the transistor 420 is decoupled from the node WL, the node WL is then pulled down to the negative voltage supply.

The memory device can be placed in a stand-by mode by making the pumped voltage Vpmp held at ground potential. This turns off the transistor 422 to decouple the node WL from the transistor 420. If the transistor 418 is turned off by a positive voltage level at the node A, the node WL is then under the control of the negative voltage supply. For stand-by mode, the negative voltage supply Vn is switched to place the node WL at ground. The memory device is switched out of the stand-by mode by quickly pumping the voltage Vpmp to a negative level. This can be done using a big capacitor to boost the pumped signal down to a negative level.

Figure 5:
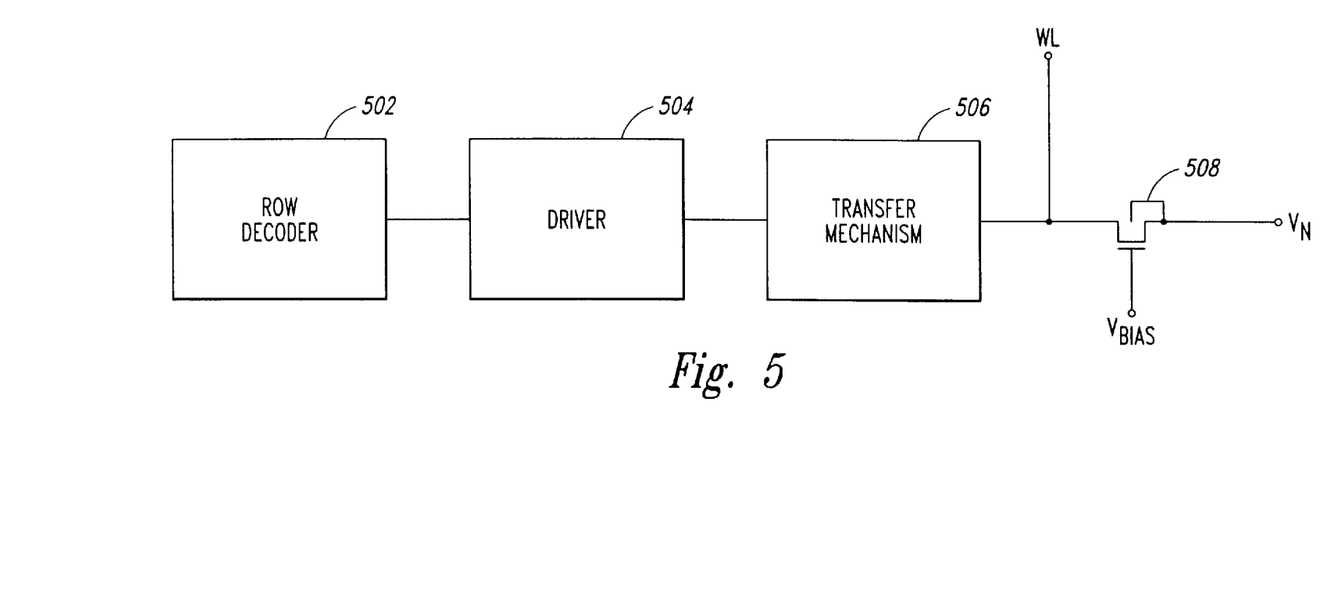
FIG. 5 is a circuit diagram of a decoder according to one aspect of the present invention.

FIG. 5 is a circuit diagram of a decoder 500 according to one aspect of the present invention. The decoder 500 includes a row decoder 502, a driver 504, and a transfer mechanism 506. The row decoder 502 is similar to the row decoder 202 discussed in FIG. 2. The driver 504 is similar to the driver 204 discussed in FIG. 2. The transfer mechanism 506 is similar to the transfer mechanism 206 discussed in FIG. 2. The discussion in FIG. 2 that is pertinent to these similar elements illustrated in FIG. 5 is incorporated here in full.

The decoder 500 includes a limiter 508 formed by an n-channel transistor having a gate, a source, a drain, and a well. In one embodiment, the limiter 508 is configured as a current mirror. The gate of the limiter 508 is coupled to a signal Vbias, the drain is coupled to the transfer mechanism 506, the source is coupled to the negative voltage supply Vn, and the well is coupled to the negative voltage supply. The Vbias is selected so as to limit the current flowing from the negative voltage supply to the WL node. In one embodiment, the transistor of the limiter 508 is set to operate in a saturation mode.

Figure 6:
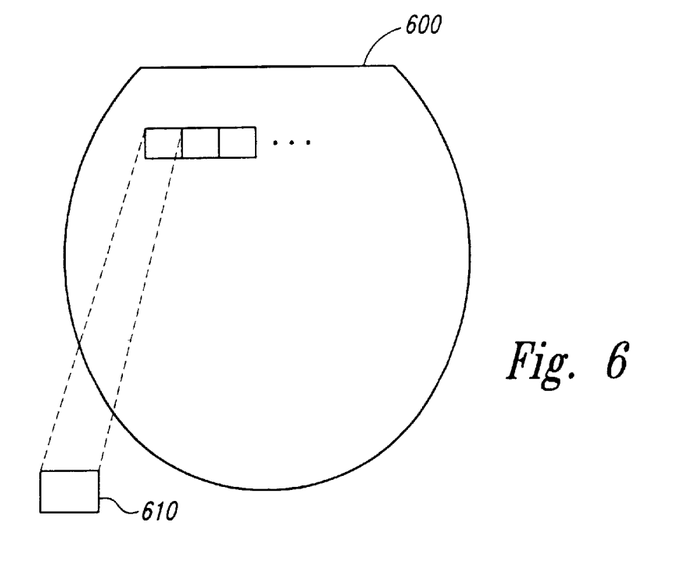
FIG. 6 is an elevation view of a semiconductor wafer according to one aspect of the present invention.

FIG. 6 is an elevation view of a semiconductor wafer according to one embodiment of the present invention. In one embodiment, a semiconductor die 610 is produced from a wafer 600. A die is an individual pattern, typically rectangular, on a substrate that contains circuitry, or integrated circuit devices, to perform a specific function. At least one of the integrated circuit devices includes a decoder as discussed in the various embodiments hereinbefore in accordance with the invention. A semiconductor wafer will typically contain a repeated pattern of such dies containing the same functionality. Die 610 may contain circuitry for the inventive memory device, as discussed above. Die 610 may further contain additional circuitry to extend to such complex devices as a monolithic processor with multiple functionalities. Die 610 is typically packaged in a protective casing (not shown) with leads extending therefrom (not shown) providing access to the circuitry of the die for unilateral or bilateral communication and control.

Figure 7:
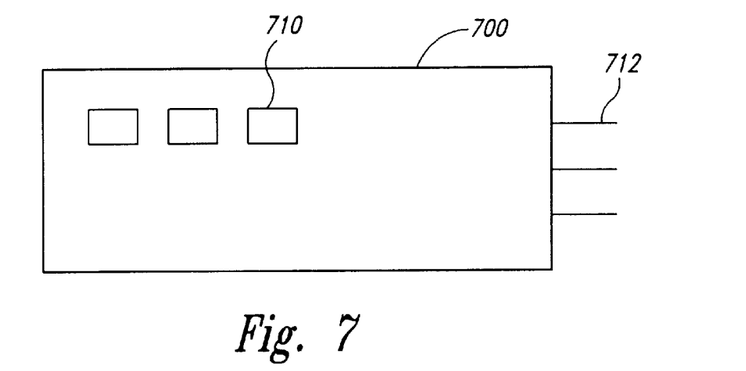
FIG. 7 is a block diagram of a circuit module according to one aspect of the present invention.

FIG. 7 is a block diagram of a circuit module according to one embodiment of the present invention. Two or more dies 710 may be combined, with or without protective casing, into a circuit module 700 to enhance or extend the functionality of an individual die 710. Circuit module 700 may be a combination of dies 710 representing a variety of functions, or a combination of dies 710 containing the same functionality. One or more dies 710 of circuit module 700 contains at least one decoder in accordance with the embodiments of the present invention.

Some examples of a circuit module include memory modules, device drivers, power modules, communication modems, processor modules, and application-specific modules, and may include multiplayer, multichip modules. Circuit module 700 may be a subcomponent of a variety of electronic systems, such as a clock, a television, a cell phone, a personal computer, an automobile, an industrial control system, an aircraft, and others. Circuit module 700 will have a variety of leads 712 extending therefrom and coupled to the dies 710 providing unilateral or bilateral communication and control.

Figure 8:
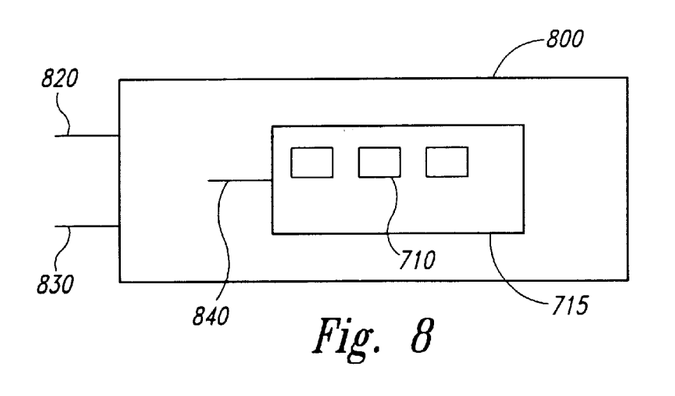
FIG. 8 is a block diagram of a memory module according to one embodiment of the present invention.

FIG. 8 is a block diagram of a memory module according to one embodiment of the present invention. Memory module 800 contains multiple memory devices 810 contained on support 815, the number depending upon the desired bus width and the desire for parity. Memory module 800 accepts a command signal from an external controller (not shown) on a command link 820 and provides for data input and data output on data links 830. The command link 820 and data links 830 are connected to leads 840 extending from the support 815. Leads 840 are shown for conceptual purposes and are not limited to the positions as shown. At least one of the memory devices 810 includes a decoder as discussed in various embodiments in accordance with the invention.

Figure 9:
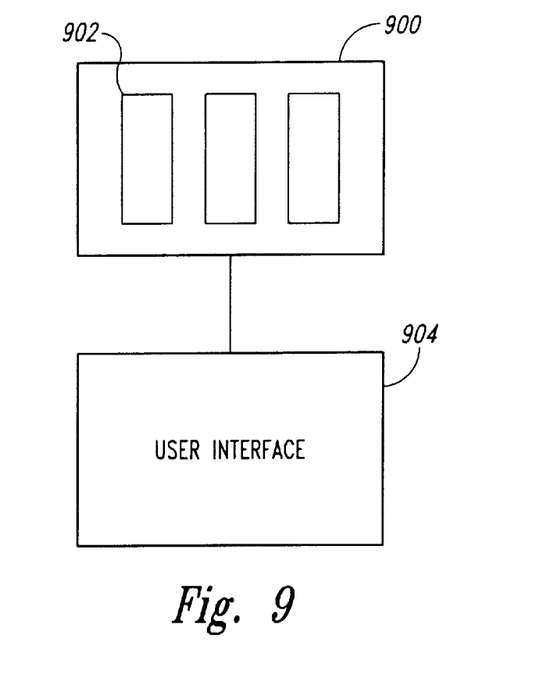
FIG. 9 is a block diagram of an electronic system according to one embodiment of the present invention.

FIG. 9 is a block diagram of a electronic system according to one embodiment of the present invention. Electronic system 900 contains one or more circuit modules 902. Electronic system 900 generally contains a user interface 904. User interface 904 provides a user of the electronic system 900 with some form of control or observation of the results of the electronic system 900. Some examples of user interface 904 include the keyboard, a pointing device, monitor, or printer of a personal computer; the tuning dial, display, or speakers of a radio; the ignition switch, gauges, or gas pedal of an automobile; and the card reader, keypad, display, or currency dispenser of an automated teller machine. User interface 904 may further describe access ports provided to electronic system 900. Access ports are used to connect an electronic system to the more tangible user interface components previously exemplified. One or more of the circuit modules 902 may be a processor providing some form of manipulation, control, or direction of inputs from or outputs to user interface 904, or of other information either preprogrammed into, or otherwise provided to, electronic system 900. As will be apparent from the lists of examples previously given, electronic system 900 will often contain certain mechanical components (not shown) in addition to circuit modules 902 and user interface 904. It will be appreciated that the one or more circuit modules 902 in electronic system 900 can be replaced by a single integrated circuit. Furthermore, electronic system 900 may be a subcomponent of a larger electronic system. At least one of the circuit modules 902 includes a memory cell that includes an inhibiting layer as discussed in various embodiments in accordance with the invention.

Figure 10:
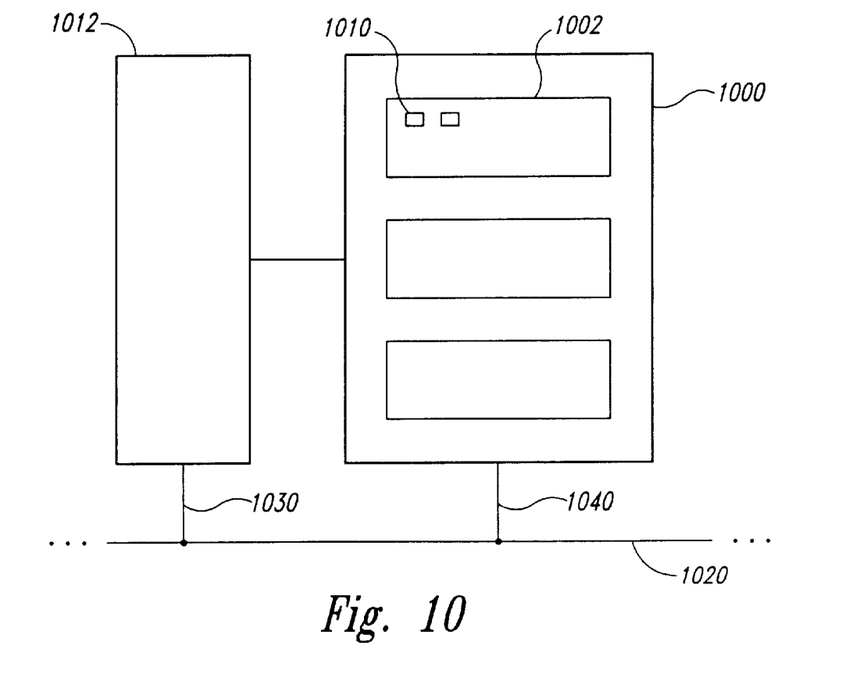
FIG. 10 is a block diagram of a memory system according to one embodiment of the present invention.

FIG. 10 is a block diagram of a memory system according to one embodiment of the present invention. Memory system 1000 contains one or more memory modules 1002 and a memory controller 1012. Each memory module 1002 includes at least one memory device 1010. Memory controller 1012 provides and controls a bidirectional interface between memory system 1000 and an external system bus 1020. Memory system 1000 accepts a command signal from the external bus 1020 and relays it to the one or more memory modules 1002 on a command link 1030. Memory system 1000 provides for data input and data output between the one or more memory modules 1002 and external system bus 1020 on data links 1040. At least one of the memory devices 1010 includes a decoder as discussed in various embodiments in accordance with the invention.

Figure 11:
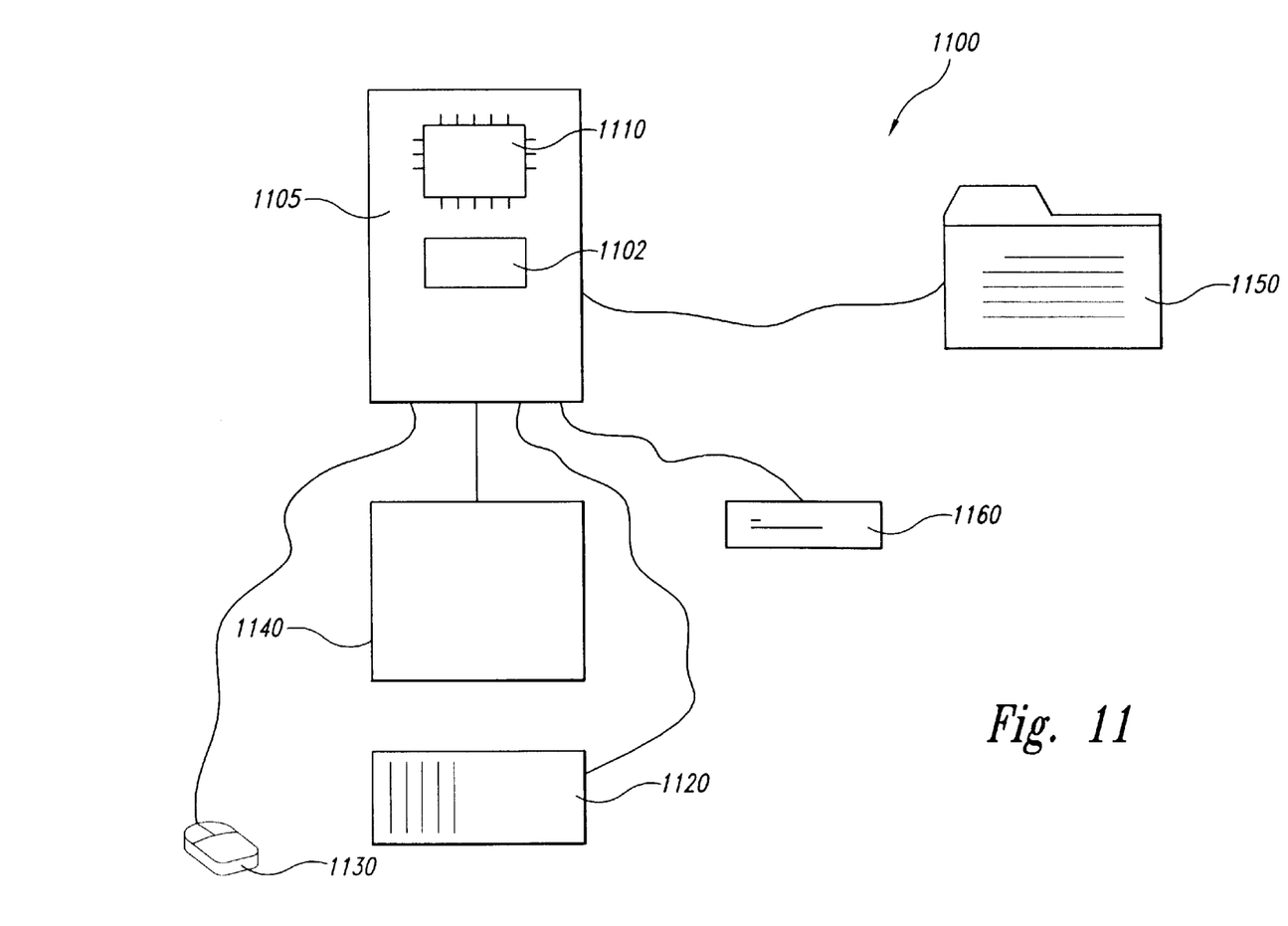
FIG. 11 is a block diagram of a computer system according to one embodiment of the present invention.

FIG. 11 is a block diagram of a computer system according to one embodiment of the present invention. Computer system 1000 contains a processor 1110 and a memory system 1102 housed in a computer unit 1105. Computer system 1100 is but one example of an electronic system containing another electronic system, e.g., memory system 1102, as a subcomponent. The memory system 1102 may include a memory cell that includes an inhibiting layer as discussed in various embodiments of the present invention. Computer system 1100 optionally contains user interface components. These user interface components include a keyboard 1120, a pointing device 1130, a monitor 1140, a printer 1150, and a bulk storage device 1160. It will be appreciated that other components are often associated with computer system 1100 such as modems, device driver cards, additional storage devices, etc. It will further be appreciated that the processor 1110 and memory system 1102 of computer system 1100 can be incorporated on a single integrated circuit. Such single-package processing units reduce the communication time between the processor and the memory circuit.

Although the specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the fill scope of equivalents to which such claims are entitled.

I claim:

1. A decoder for addressing a non-volatile memory device, comprising:
   a row decoder having a NAND gate that receives input signals and produces a processed signal, the row decoder further having a first n-channel transistor having a gate receiving a multiplexed signal, a source receiving the processed signal, and a drain that outputs a decoded signal when the multiplexed signal is at a high level, and a second n-channel transistor having a gate receiving the inverse of the multiplexed signal and a source coupled to the drain of the first n-channel transistor to pull the decoded signal to a voltage supply when the multiplexed signal is at a low level;
   a driver that receives the decoded signal to drive a word line;
   a limiter that couples the word line to a negative voltage supply, the limiter limiting the current supplied to the word line by the negative voltage supply so as to inhibit a flow of charge from the negative voltage supply; and a transfer mechanism coupled to the driver and the limiter for decoupling the driver from the word line to enable the negative voltage supply to charge the word line.

2. The decoder of claim 1, wherein the limiter comprises a resistive element formed from a highly resistive compound.

3. The decoder of claim 1, wherein the limiter comprises a resistive element formed from doped polysilicon.

4. The decoder of claim 1, wherein the limiter comprises a resistor.

5. The decoder of claim 1, wherein the limiter comprises a three-terminal device having a gate coupled to a bias signal to limit the current of the negative supply to the word line, a source coupled to the negative supply, a drain coupled to the word line, and a well coupled to the source.

6. A decoder for addressing a non-volatile memory device, comprising:
    a row decoder having a NAND gate that receives input signals and produces a processed signal, the row decoder further having a first n-channel transistor having a gate receiving a multiplexed signal, a source receiving the processed signal, and a drain that outputs a decoded signal when the multiplexed signal is at a high level, and a second n-channels transistor having a gate receiving the inverse of the multiplexed signal and a source coupled to the drain of the first n-channel transistor to pull the decoded signal to a voltage supply when the multiplexed signal is at a low level;
    a driver that receives the decoded signal to drive a node with a node signal;
    a transfer mechanism to selectively transfer the node signal to a word line; and
    a limiter electrically coupled between the word line and a negative supply to limit current drawn by the negative supply.

7. The decoder of claim 6, wherein the non-volatile memory device includes a Flash memory device.

8. The decoder of claim 6, wherein the driver includes an inverter having an input and an output, and wherein the inverter couples to a programming voltage supply.

9. The decoder of claim 8, wherein the driver further includes a p-channel transistor having a gate, a source, and a drain, wherein the gate of the p-channel transistor couples to the output of the inverter, wherein the source couples to the programming voltage supply, and the drain couples to the input of the inverter.

10. The decoder of claim 8, wherein the transfer mechanism includes a three-terminal device having a gate, a source, and a drain, wherein the gate of the three-terminal device receives a pumped voltage signal, wherein the source of the three-terminal device couples to the node, wherein the inverter includes an n-channel transistor having a gate, a source, and a drain, wherein the gate of the n-channel transistor couples to the input of the inverter, wherein the source couples to ground, and wherein the drain of the n-channel transistor couples to the drain of the three-terminal device.

11. The decoder of claim 6, wherein the transfer mechanism includes a three-terminal device having a gate, a source, and a drain, wherein the gate of the three-terminal device receives a pumped voltage signal, wherein the source of the three-terminal device couples to the node, and wherein the drain of the three-terminal device couples to the limiter.

12. The decoder of claim 6, wherein the limiter includes a three-terminal device having a gate, a source, a drain, and a well, wherein the gate of the three-terminal device couples to a bias signal to limit the current from the negative supply to the word line, wherein the source of the three-terminal device couples to the negative supply, wherein the drain of the three-terminal device couples to the word line, and wherein the well of the three-terminal device couples to the negative supply.

13. A method for decoding a non-volatile memory device, comprising:
    decoding a set of input signals to produce a row decoded signal;
    driving the row decoded signal so as to present a word line;
    continuously providing a negative voltage to the word line from a negative supply coupled thereto; and
    limiting a rate of flow of electric charge from the negative supply to the word line so as to inhibit a flow of electric charge from the negative supply to the word line.

14. The method of claim 13, further comprising repairing the non-volatile memory device when the word line is coupled to a bit line, wherein the act of repairing executes after the act of limiting limits the rate of flow of electric charge.

15. The method of claim 13, wherein decoding includes decoding a set of input signals and resetting a decoder in response to at least one of the input signals.

16. The method of claim 15, wherein the set of input signals includes a set of pre-decode row signals and a selection signal and resetting the decoder comprises resetting the decoder in response to the selection signal having a low level.

17. The method of claim 15, wherein the set of input signals includes a set of pre-decode row signals and a selection signal and resetting the decoder comprises resetting the decoder in response to the pre-decode row signals having a low level.

18. The method of claim 13, wherein driving includes driving the word line to a voltage supply, wherein the voltage supply becomes the positive programming voltage supply when the non-volatile memory device is in a programming mode.

19. A method for decoding a non-volatile memory device, comprising:
    decoding a set of input signals to present a row decoded signal;
    driving a node by a driver that receives the decoded signal;
    transferring a signal driving the node to a word line by a transfer mechanism;
    continuously providing a negative voltage to the word line from a negative supply coupled thereto; and
    limiting a rate of flow of electric charge from a negative supply to the word line so as to inhibit a flow of electric charge from the negative supply to the word line.

20. The method of claim 19, wherein driving includes driving the node to ground when the row decoded signal is at a high level.

21. The method of claim 20, wherein transferring includes presenting a pumped signal, which is at a low level, to a gate of the transfer mechanism so as to allow the negative supply to pull the voltage level of the word line to a negative level.

22. The method of claim 20, wherein transferring includes presenting a pumped signal, which is at a negative level, to a gate of the transfer mechanism so as to allow the driver to drive the voltage level of the word line to ground.

23. A method for programming a non-volatile memory device, comprising:

continuously providing a negative voltage to a word line from a current limited negative supply coupled thereto;

selecting the word line to access a group of cells for programming;

deselecting other word lines so as to inhibit programming of other cells;

driving the other word lines with the current limited negative supply; and writing to a desired cell selected by the word line by transferring a programming signal to the word line and decoupling the other word lines while the current limited negative supply is driving the other word lines so as to inhibit charge leakage on other cells.

24. The method of claim 23, wherein selecting includes decoding a set of input signals to present a row decoded signal to select a desired row of cells for programming.

25. The method of claim 23, wherein deselecting includes decoding a set of input signals to present a row decoded signal to deselect one cell of other cells.

26. The method of claim 23, wherein transferring includes presenting a pumped voltage signal, which is at a low level, to a transfer mechanism so as to enable the negative supply to drive the other word lines.

27. The method of claim 23, wherein transferring includes pulling other word lines to a negative level during the period of programming the non-volatile memory device.

28. A memory device, comprising:
    an array of memory cells;
    an address decoder;
    a column access circuitry;
    an input/output circuit; and
    a row access circuitry, wherein the row access circuitry includes:
        a row decoder having a NAND gate that receives input signals and produces a processed signal, the row decoder further having a first n-channel transistor having a gate receiving a multiplexed signal, a source receiving the processed signal, and a drain that outputs a decoded signal when the multiplexed signal is at a high level, and a second n-channels transistor having a gate receiving the inverse of the multiplexed signal and a source coupled to the drain of the first n-channel transistor to pull the decoded signal to a voltage supply when the multiplexed signal is at a low level;
        a driver that receives the decoded signal to drive a node with a node signal;
        a transfer mechanism to selectively transfer the node signal to a word line; and
        a limiter electrically coupled between the word line and a negative supply to limit current drawn by the negative supply.

29. The memory device of claim 28, wherein the limiter comprises a resistive element formed from a highly resistive compound, the limiter limits the current supplied to the word line so as to allow the non-volatile memory device to be repaired.

30. The memory device of claim 28, wherein the limiter comprises a resistive element formed from doped polysilicon, the limiter limits the current supplied to the word line so as to allow the non-volatile memory device to be repaired.

31. The memory device of claim 28, wherein the limiter comprises a resistor, the limiter limits the current supplied to the word line so as to allow the non-volatile memory device to be repaired.

32. The memory device of claim 28, wherein the transfer mechanism includes a three-terminal device having a gate, a source, and a drain, wherein the gate of the three-terminal device receives a pumped voltage signal, wherein the source of the three-terminal device couples to the node, and wherein the drain of the three-terminal device couples to the limiter.

33. The memory device of claim 28, wherein the transfer mechanism includes a three-terminal device having a gate, a source, and a drain, wherein the gate of the three-terminal device receives a pumped voltage signal, wherein the source of the three-terminal device couples to the node, and the driver includes an inverter having an n-channel transistor having a gate, a source, and a drain, wherein the gate of the n-channel transistor couples to the input of the inverter, wherein the source couples to ground, and wherein the drain of the n-channel transistor couples to the drain of the three-terminal device.

34. The memory device of claim 28, wherein the limiter includes a three-terminal device having a gate, a source, a drain, and a well, wherein the gate of the three-terminal device couples to a bias signal to limit the current from the negative supply to the word line, wherein the source of the three-terminal device couples to the negative supply, wherein the drain of the three-terminal device couples to the word line, and wherein the well of the three-terminal device couples to the negative supply.

35. A memory module, comprising:
    a plurality of memory devices;
    a plurality of command links coupled to the plurality of memory devices to communicate at least one command signal;
    a plurality of data links coupled to the plurality of memory devices to communicate data, wherein the plurality of memory devices include:
        an array of memory cells;
        a row decoder having a NAND gate that receives input signals and produces a processed signal, the row decoder further having a first n-channel transistor having a gate receiving a multiplexed signal, a source receiving the processed signal, and a drain that outputs a decoded signal when the multiplexed signal is at a high level, and a second n-channels transistor having a gate receiving the inverse of the multiplexed signal and a source coupled to the drain of the first n-channel transistor to pull the decoded signal to a voltage supply when the multiplexed signal is at a low level;
        a driver that receives the decoded signal to drive a node with a node signal;
        a transfer mechanism to selectively transfer the node signal to a word line; and
        a limiter electrically coupled between the word line and a negative supply to limit current drawn by the negative supply.

36. The memory module of claim 35, wherein the limiter of the memory devices comprises a resistive element formed from a highly resistive compound, the limiter limits the current supplied to the word line so as to allow the non-volatile memory device to be repaired.

37. The memory module of claim 35, wherein the limiter of the memory devices comprises a resistive element formed from doped polysilicon, the limiter limits the current supplied to the word line so as to allow the non-volatile memory device to be repaired.

38. The memory module of claim 35, wherein the limiter of the memory devices comprises a resistor, the limiter limits the current supplied to the word line so as to allow the non-volatile memory device to be repaired.

39. The memory module of claim 35, wherein the transfer mechanism of the memory devices includes a three-terminal device having a gate, a source, and a drain, wherein the gate of the three-terminal device receives a pumped voltage signal, wherein the source of the three-terminal device couples to the node, and wherein the drain of the three-terminal device couples to the limiter.

40. The memory module of claim 35, wherein the transfer mechanism of the memory devices includes a three-terminal device having a gate, a source, and a drain, wherein the gate of the three-terminal device receives a pumped voltage signal, wherein the source of the three-terminal device couples to the node, and the driver includes an inverter having an n-channel transistor having a gate, a source, and a drain, wherein the gate of the n-channel transistor couples to the input of the inverter, wherein the source couples to ground, and wherein the drain of the n-channel transistor couples to the drain of the three-terminal device.

41. The memory module of claim 35, wherein the limiter of the memory devices includes a three-terminal device having a gate, a source, a drain, and a well, wherein the gate of the three-terminal device couples to a bias signal to limit the current from the negative supply to the word line, wherein the source of the three-terminal device couples to the negative supply, wherein the drain of the three-terminal device couples to the word line, and wherein the well of the three-terminal device couples to the negative supply.

42. A computer system, comprising:
   a processor;
   a memory system that comprises a plurality of memory modules, one of the plurality of the memory modules comprises a plurality of memory devices;
   a plurality of command links coupled to the plurality of memory devices to communicate at least one command signal;
   a plurality of data links coupled to the plurality of memory devices to communicate data;
   a memory controller;
   at least one user interface device, wherein the at least one user interface device includes a monitor;
   at least one output device, wherein the at least one output device includes a printer;
   at least one bulk storage device, wherein at least one memory device includes:
      an array of memory cells;
      a row decoder having a NAND gate that receives input signals and produces a processed signal, the row decoder further having a first n-channel transistor having a gate receiving a multiplexed signal, a source receiving the processed signal, and a drain that outputs a decoded signal when the multiplexed signal is at a high level, and a second n-channels transistor having a gate receiving the inverse of the multiplexed signal and a source coupled to the drain of the first n-channel transistor to pull the decoded signal to a voltage supply when the multiplexed signal is at a low level;
      a driver that receives the decoded signal to drive a node with a node signal;
      a transfer mechanism to selectively transfer the node signal to a word line; and
      a limiter electrically coupled between the word line and a negative supply to limit current drawn by the negative supply.

43. The computer system of claim 42, wherein the limiter of the memory device comprises a resistive element formed from a highly resistive compound, the limiter limits the current supplied to the word line so as to allow the non-volatile memory device to be repaired.

44. The computer system of claim 42, wherein the limiter of the memory device comprises a resistive element formed from doped polysilicon, the limiter limits the current supplied to the word line so as to allow the non-volatile memory device to be repaired.

45. The computer system of claim 42, wherein the limiter of the memory device comprises a resistor, the limiter limits the current supplied to the word line so as to allow the non-volatile memory device to be repaired.

46. The computer system of claim 42, wherein the transfer mechanism of the memory device includes a three-terminal device having a gate, a source, and a drain, wherein the gate of the three-terminal device receives a pumped voltage signal, wherein the source of the three-terminal device couples to the node, and wherein the drain of the three-terminal device couples to the limiter.

47. The computer system of claim 42, wherein the transfer mechanism of the memory device includes a three-terminal device having a gate, a source, and a drain, wherein the gate of the three-terminal device receives a pumped voltage signal, wherein the source of the three-terminal device couples to the node, and the driver includes an inverter having an n-channel transistor having a gate, a source, and a drain, wherein the gate of the n-channel transistor couples to the input of the inverter, wherein the source couples to ground, and wherein the drain of the n-channel transistor couples to the drain of the three-terminal device.

48. The computer system of claim 42, wherein the limiter of the memory device includes a three-terminal device having a gate, a source, a drain, and a well, wherein the gate of the three-terminal device couples to a bias signal to limit the current from the negative supply to the word line, wherein the source of the three-terminal device couples to the negative supply, wherein the drain of the three-terminal device couples to the word line, and wherein the well of the three-terminal device couples to the negative supply.

49. A decoder for addressing a non-volatile memory device, comprising:
   a word line that is coupled to a row of cells so as to allow access;
   a negative supply to supply a negative voltage;
   a row decoder having a NAND gate that receives input signals and produces a processed signal, the row decoder further having a first n-channel transistor having a gate receiving a multiplexed signal, a source receiving the processed signal, and a drain that outputs a decoded signal when the multiplexed signal is at a high level, and a second n-channels transistor having a gate receiving the inverse of the multiplexed signal and a source coupled to the drain of the first n-channel transistor to pull the decoded signal to a voltage supply when the multiplexed signal is at a low level;
   a driver that receives the decoded signal to drive the word line;
   a limiter that couples the word line to the negative supply, the limiter limiting the current supplied to the word line by the negative supply so as to inhibit a flow of charge from the negative supply; and
   a transfer mechanism coupled to the driver and the limiter for decoupling the driver from the word line to enable the negative voltage supply to charge the word line.

50. A decoder for addressing a non-volatile memory device, comprising:
- a row decoder that receives input signals and outputs a decoded signal;
- a driver that receives the decoded signal to drive a word line coupled to the output of the driver, the driver having an inverter including an n-channel transistor having a gate at which the input signals are received, a source coupled to ground, and a drain;
- a transfer mechanism having a gate receiving a pumped voltage signal, a source coupled to the output of the driver, and a drain coupled to the drain of the n-channel transistor of the inverter; and
- a limiter that couples the word line to a negative voltage supply, the limiter limiting the current supplied to the word line by the negative voltage supply so as to inhibit a flow of charge from the negative voltage supply.

51. The decoder of claim 50 wherein the limiter comprises a resistor.

52. The decoder of claim 50 wherein the limiter comprises a resistive element formed from a highly resistive compound.

53. The decoder of claim 50 wherein the limiter comprises a resistive element formed from doped polysilicon.

54. The decoder of claim 50 wherein the limiter comprises a three-terminal device having a gate coupled to a bias signal to limit the current of the negative supply to the word line, a source coupled to the negative supply, a drain coupled to the word line, and a well coupled to the source.

55. The decoder of claim 50 Wherein the driver further includes a p-channel transistor having a gate coupled to the source of the transfer mechanism, a source coupled to a voltage source and a drain coupled to the gate of the n-channel transistor of the inverter.

56. A memory device, comprising:
- an array of memory cells;
- an address decoder;
- a column access circuitry;
- an input/output circuit; and
- a row access circuitry, wherein the row access circuitry includes:
  - a row decoder that receives input signals and outputs a decoded signal;
  - a driver that receives the decoded signal to drive a word line coupled to the output of the driver, the driver having an inverter including an n-channel transistor having a gate at which the input signals are received, a source coupled to ground, and a drain;
  - a transfer mechanism having a gate receiving a pumped voltage signal, a source coupled to the output of the driver, and a drain coupled to the drain of the n-channel transistor of the inverter; and
  - a limiter that couples the word line to a negative voltage supply, the limiter limiting the current supplied to the word line by the negative voltage supply so as to inhibit a flow of charge from the negative voltage supply.

57. The memory device of claim 56 wherein the limiter of the row access circuitry comprises a resistor.

58. The memory device of claim 56 wherein the limiter of the row access circuitry comprises a resistive element formed from a highly resistive compound.

59. The memory device of claim 56 wherein the limiter of the row access circuitry comprises a resistive element formed from doped polysilicon.

60. The memory device of claim 56 wherein the limiter of the row access circuitry comprises a three-terminal device having a gate coupled to a bias signal to limit the current of the negative supply to the word line, a source coupled to the negative supply, a drain coupled to the word line, and a well coupled to the source.

61. The memory device of claim 56 wherein the driver of the row access circuitry further includes a p-channel transistor having a gate coupled to the source of the transfer mechanism, a source coupled to a voltage source and a drain coupled to the gate of the n-channel transistor of the inverter.

62. A computer system, comprising:
- a processor;
- a memory system that comprises a plurality of memory modules, one of the plurality of the memory modules comprises a plurality of memory devices;
- a plurality of command links coupled to the plurality of memory devices to communicate at least one command signal;
- a plurality of data links coupled to the plurality of memory devices to communicate data;
- a memory controller;
- at least one user interface device, wherein the at least one user interface device includes a monitor;
- at least one output device, wherein the at least one output device includes a printer;
- at least one bulk storage device, wherein at least one memory device includes:
  - an array of memory cells;
  - a row decoder that receives input signals and outputs a decoded signal;
  - a driver that receives the decoded signal to drive a word line coupled to the output of the driver, the driver having an inverter including an n-channel transistor having a gate at which the input signals are received, a source coupled to ground, and a drain;
  - a transfer mechanism having a gate receiving a pumped voltage signal, a source coupled to the output of the driver, and a drain coupled to the drain of the n-channel transistor of the inverter; and
  - a limiter that couples the word line to a negative voltage supply, the limiter limiting the current supplied to the word line by the negative voltage supply so as to inhibit a flow of charge from the negative voltage supply.

63. The computer system of claim 62 wherein the limiter of the memory device comprises a resistor.

64. The computer system of claim 62 wherein the limiter of the memory device comprises a resistive element formed from a highly resistive compound.

65. The computer system of claim 62 wherein the limiter of the memory device comprises a resistive element formed from doped polysilicon.

66. The computer system of claim 62 wherein the limiter of the memory device comprises a three-terminal device having a gate coupled to a bias signal to limit the current of the negative supply to the word line, a source coupled to the negative supply, a drain coupled to the word line, and a well coupled to the source.

67. The computer system of claim 62 wherein the driver of the memory device further includes a p-channel transistor having a gate coupled to the source of the transfer mechanism, a source coupled to a voltage source and a drain coupled to the gate of the n-channel transistor of the inverter.

* * * * *